(12) United States Patent
Kimura et al.

(10) Patent No.: US 7,645,562 B2
(45) Date of Patent: Jan. 12, 2010

(54) PHOTOSENSITIVE FILM

(75) Inventors: Jinko Kimura, Hitachi (JP); Chikara Ishikawa, Takahagi (JP); Youji Tanaka, Hitachi (JP); Shinji Takano, Hitachi (JP); Yoshitaka Minami, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 11/558,177

(22) Filed: Nov. 9, 2006

(65) Prior Publication Data

US 2007/0092835 A1 Apr. 26, 2007

Related U.S. Application Data

(62) Division of application No. 09/508,771, filed as application No. PCT/JP98/04184 on Sep. 17, 1998.

(30) Foreign Application Priority Data

Sep. 19, 1997 (JP) ................................ 09/254816

(51) Int. Cl.
G03F 7/00 (2006.01)
G03F 7/004 (2006.01)
(52) U.S. Cl. ................. 430/273.1; 430/270.1
(58) Field of Classification Search ............. 430/270.1, 430/273.1
See application file for complete search history.

(56) References Cited

U.S. PATENT DOCUMENTS 4,284,707 A * 8/1981 Nagasawa et al. ........... 430/196
4,360,582 A * 11/1982 Taguchi et al. ............... 430/260
4,698,292 A 10/1987 Hilger et al.
4,710,446 A * 12/1987 Hoffmann et al. ......... 430/281.1
4,826,888 A * 5/1989 Sasaki et al. ................. 522/26
5,198,484 A * 3/1993 Mannion .................... 524/108
5,589,306 A 12/1996 Takahashi et al.
5,932,341 A 8/1999 Endo et al.
6,037,100 A 3/2000 Yu et al.
6,133,343 A 10/2000 Hatanaka et al.
6,664,346 B2 12/2003 Tsutsumi et al.
6,922,890 B2 8/2005 Dai et al.

FOREIGN PATENT DOCUMENTS

DE 3825782 2/1989
EP 0091693 10/1983
GB 2049972 12/1980

* cited by examiner

Primary Examiner—Amanda C. Walke
(74) Attorney, Agent, or Firm—Griffin & Szipl, P.C.

(57) ABSTRACT

A photosensitive film excellent in workability and making it possible, in a normal pressure laminating process, to laminate photosensitive films on the surface of substrate having a metallic surface with a reduced number of air voids generated and in a high product yield, said film comprising a support film (A), a photosensitive resin composition-containing photosensitive resin layer (B) formed on said support (A) and a protecting film (C) further stuck on said layer (B), wherein the number of fish eyes having a diameter of at least 80 μm included in the protecting film (C) does not exceed 5 fish eyes/m².

13 Claims, 1 Drawing Sheet

LAMINATION

PHOTOSENSITIVE FILM

This application is a Divisional of U.S. patent application Ser. No. 09/508,771, filed Mar. 16, 2000, which is a National Phase Application in the United States of International Patent Application No. PCT/JP98/04184 filed Sep. 17, 1998, which claims priority on Japanese Patent Application No. 09-254816, filed Sep. 19, 1997. The entire disclosures of the above patent applications are hereby incorporated by reference.

TECHNICAL FIELD

This invention relates to a photosensitive film successfully usable in metal etching fabrications of lead frame, metal mask, etc.

BACKGROUND ART

In the field of current semiconductor elements, there is a growing tendency of lessening the weight, decreasing the thickness, reducing the size of elements and manufacturing such elements in a small lot-high variety manner. As a result of this tendency, the lead frame used for mounting IC chips on substrate is required to have an increased number of pins in a more slender and smaller size. On the other hand, the stamping process is unable to produce such small-sized articles satisfying the requirement of the miniaturization because of elevated cost of metallic die needed by the small lot-high variety production. Thus, the etching process is advantageous over the stamping process for the small lot-high variety production because it can produce small-sized articles without using any metallic die. The etching process uses a photosensitive resin in either of the three forms, namely water-soluble photosensitive resin, solvent-containing liquid photosensitive resin and photosensitive film.

The use of liquid photosensitive resin has general faults in that an enormous investment must be made in the coating apparatus, the coating process requires considerably much labor, serviceable lives of the photosensitive resin itself and the coated film of photosensitive resin are short, and sensitivity is low. In addition, individual cases have their own faults. For instance, the water-soluble liquid photosensitive resin in which casein or PVA (polyvinyl alcohol) is cured with a chromic acid salt has a problem that a complicated step of waste water treatment must be provided for the disposal of harmful heavy metal salt after use. On the other hand, the solvent-containing liquid photosensitive resin has a problem that an organic solvent is discharged into the atmospheric air in the course of coating, which exercises an adverse influence upon environments.

On the other hand, the photosensitive film has a sandwich structure in which a photosensitive resin composition is coated on a transparent support film, dried and then covered with a protecting film. At the time of lamination, the protecting film is removed and at the same time the photosensitive resin layer is thermally press-bonded to the underlying metal to form an image. Accordingly, the photosensitive film is lower in the cost for equipments, higher in sensitivity and longer in the working life than the above-mentioned liquid photosensitive resins, and is superior in the suitability for metallic precision fabrications.

As the support film of the photosensitive film, polyester films such as PET (polyethylene terephthalate) film are generally used. As the protecting film, polyolefin films such as PE (polyethylene) film are generally used. The protecting film is removed at the time of lamination. The polyolefin film conventionally used as a protecting film is produced by thermally melting and kneading a raw material and then forming it by extrusion, biaxial orientation or casting. In general, protecting films of polyolefin or the like include unmelted materials or thermally deteriorated regions called fish eyes. The fish eye usually has a diameter ($\phi$) of 30 to 600 μm, forming a protrusion on the film surface up to a height of 2 to 40 μm. The convex portions of the fish eyes are transferred onto the photosensitive resin layer to form concavities on the photosensitive resin layer, so that air voids 6 are formed on the substrate after lamination as seen in FIG. 1B. That is to say, if a photosensitive film comprising a support film 1, a photosensitive resin layer 2 and a protecting film 3 carrying fish eyes 4 (see: FIG. 1A) is laminated, after releasing the protecting film 3 therefrom, onto a substrate 5, air voids appear as seen in FIG. 1B. Formation of the air voids has a relation with film thickness of the photosensitive resin layer so that a smaller film thickness of photosensitive resin layer causes a more ready formation of air voids. The presence of such air voids causes formation of defective pattern and breakage of wire in the subsequent steps of exposure, development and etching.

As a means for preventing such phenomena, JP-A 3-12402 discloses the use of a film having a flat and smooth surface as the releasable film at the time of lamination. The method of JP-A 3-12402, however, is characterized by coating a photosensitive resin composition onto a releasable film to be peeled off at the time of lamination and drying the coat to form a photosensitive resin layer, followed by laminating thereon a support film. The releasable film must be selected from materials showing no thermal dimensional change when it is coated with a photosensitive resin composition and dried. In other words, the materials usable for this purpose are restricted.

Apart from the above, the method of vacuum lamination is useful as mentioned in JP-A 52-66581, JP-A 51-63702, and JP-A 1-314144. This method, however, is disadvantageous in that it needs an apparatus of larger size as compared with the conventional normal pressure lamination method and it tends to generate dusts because inner atmosphere of lamination chamber is kept at a vacuum.

DISCLOSURE OF INVENTION

It is an object of this invention to provide a photosensitive film which can be laminated by the normal pressure lamination method on the surface of a substrate having a metallic surface in a high product yield, with formation of a reduced number of air voids, and in a high workability.

It is another object of this invention to provide a photosensitive film exercising the above-mentioned effect of the invention and further exhibiting excellent lamination characteristics.

It is yet another object of this invention to provide a photosensitive film exercising the abovementioned effect of the invention and exhibiting a particularly high performance when used for metal etching fabrication of lead frame, metal mask, etc.

This invention provides a photosensitive film which comprises a support film (A), a photosensitive resin composition-containing photosensitive resin layer (B) formed on said support film (A), and a protecting film (C) stuck onto said photosensitive resin layer (B), wherein the number of fish eyes having a diameter of at least 80 μm included in said protecting film (C) does not exceed 5 fish eyes/m² and said photosensitive resin composition-containing photosensitive resin layer (B) has a film thickness of 5 to 30 μm.

BEST MODE FOR CARRYING OUT THE INVENTION

Figure 1A:
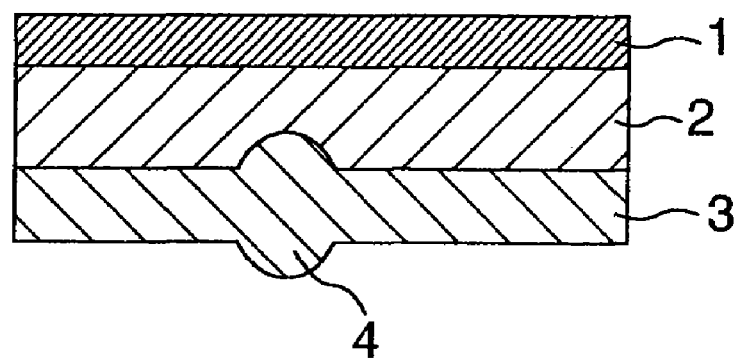
FIG. 1A and FIG. 1B are cross-sectional views illustrating the generation of air voids.
Figure 1A:
Figure 1B:
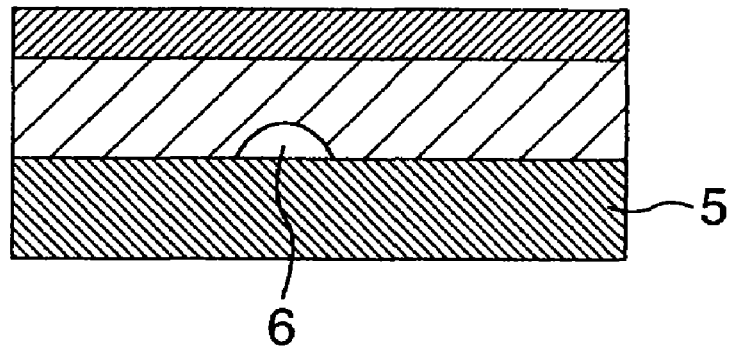

The support film (A) used in this invention is, for instance, a polyester film such as Tetoron Film GS Series manufactured by Teijin Ltd., Myler Film D Series manufactured by E. I. Du Pont de Nemours and Co., and the like. Preferably, the support film (A) is a polyethylene terephthalate film. The support film (A) preferably has a film thickness of 12 to 25 µm. If thickness of the film (A) is smaller than 12 µm, mechanical strength of the support film is low and there is a tendency that the support film is broken in the coating process. If thickness of the support film (A) is greater than 25 µm, there is a tendency that the resolution is low and the price is high.

In this invention, the photosensitive resin composition used in the photosensitive resin composition-containing photosensitive resin layer (B) is not particularly limited, so far as the composition has a photosensitivity. Preferably used compositions are those comprising:

(a) a binder polymer obtained by copolymerizing acrylic acid or methacrylic acid and alkyl esters thereof as constituent monomers, (b) a monomer having at least one polymerizable ethylenically unsaturated group in the molecule thereof, and (c) a photopolymerization initiator.

The binder polymer (a) may be any of a single binder polymer and a combination of two or more binder polymers.

As the alkyl ester of acrylic acid, for instance, methyl acrylate, ethyl acrylate, butyl acrylate, 2 ethylhexyl acrylate and the like can be referred to. These compounds may be used either singly or in combination of two or more compounds.

As the alkyl ester of methacrylic acid, for instance, methyl methacrylate, ethyl methacrylate, butyl methacrylate, 2-ethylhexyl methacrylate and the like can be referred to. These compounds may be used either singly or in combination of two or more compounds.

The acrylic acid and methacrylic acid mentioned above may be used in combination, if desired.

As the constituent monomer of the binder polymer, not only the acrylic acid, methacrylic acid and alkyl esters thereof but also vinyl monomers copolymerizable therewith can be used. As the vinyl monomers which are other than the acrylic acid, methacrylic acid and alkyl esters thereof and copolymerizable therewith, for instance, tetrahydrofurfuryl acrylate, tetrahydrofurfuryl methacrylate, dimethylaminomethyl acrylate, dimethylaminomethyl methacrylate, glycidyl acrylate, glycidyl methacrylate, 2,2,3,3-tetrafluoropropyl acrylate, 2,2,3,3-tetrafluoropropyl methacrylate, acrylamide, diaceto-acrylamide, styrene, vinyltoluene and the like can be referred to. These monomers can be used either singly or in combination of two or more monomers.

The copolymer can be synthesized by mixing together the above-mentioned components and subjecting the mixture to a known polymerization process such as solution polymerization process.

The compounding ratio of the above-mentioned constituent monomers is not particularly limited, but the monomers may be compounded at an arbitrary ratio. However, it is preferable from the viewpoint of the balance between alkali-developability and alkali-resistance to adjust the carboxyl group-content of component (a), namely the ratio of carboxyl group-containing monomers to the total monomers used, to 12 to 40% by weight.

The copolymers thus formed may be used either singly or in combination of two or more copolymers.

In this invention, the weight-average molecular weight, measured by gel permeation chromatography and calculated by referring to a standard polystyrene calibration curve, of the binder polymer (a) in the photosensitive resin composition-containing photosensitive resin layer (B) is not particularly limited. However, from the viewpoint of the balance between mechanical strength and alkali-developability, the weight-average molecular weight of binder polymer (a) is preferably in the range of from 20,000 to 300,000 and further preferably in the range of from 40,000 to 200,000. If the weight-average molecular weight is lower than 20,000, mechanical strength tends to be low. If the weight average molecular weight is higher than 300,000, alkali-developability tends to be inferior.

As the monomer (b) having at least one polymerizable ethylenically unsaturated group in the molecule thereof used in the photosensitive resin composition-containing photosensitive resin layer (B) of this invention, for instance, there can be referred to the compounds obtained by reacting a polyhydric alcohol with an α,β-unsaturated carboxylic acid such as polyethylene glycol diacrylate having 2 to 14 ethylene units, trimethylolpropane diacrylate, trimethylolpropane triacrylate, tetramethylolmethane triacrylate, tetramethylolmethane tetraacrylate, polypropylene glycol diacrylate having 2 to 14 propylene units, dipentaerythritol pentaacrylate, dipentaerythritol hexaacrylate and the like; bisphenol A polyoxyalkylene diacrylates such as 2,2-bis(4-(acryloxydiethoxy)phenyl)propane, 2,2-bis(4-(acryloxypentaethoxy)-phenyl)propane, 2,2-bis(4-acryloxydiisopropoxytriethoxy)-phenyl)propane, and the like; compounds obtained by adding an α,β-unsaturated carboxylic acid to a glycidyl group-containing compound such as trimethylolpropane triglycidyl ether triacrylate, bisphenol A diglycidyl ether diacrylate and the like; and alkyl esters of acrylic acid such as methyl acrylate, ethyl acrylate, butyl acrylate, 2-ethylhexyl acrylate and the like. The methacrylates and methacrylic esters corresponding to these compounds can also be referred to. These compounds can be used alone or as a mixture thereof. Among them, the bisphenol A polyoxyalkylene dimethacrylates are preferable from the viewpoint of sensitivity, resolution, adhesiveness and mechanical properties.

As the photopolymerization initiator (c) usable in the photosensitive resin composition-containing photosensitive resin layer (B) of this invention, for instance, there can be referred to aromatic ketones such as benzophenone, N,N'-tetramethyl-4,4'-diaminobenzophenone, N,N'-tetraethyl-4,4'-diaminobenzophenone, 4-methoxy-4'-dimethylaminobenzophenone, 2-ethylanthraquinone, phenanthrenequinone and the like; benzoin ethers such as benzoin methyl ether, benzoin ethyl ether, benzoin phenyl ether and the like; benzoins such as methylbenzoin, ethylbenzoin and the like; benzyl derivatives such as benzyl methyl ketal and the like; 2,4,5-triarylimidazole dimers such as 2-(o-chlorophenyl)-4,5-diphenylimidazole dimer, 2-(o-chlorophenyl)-4,5-di(m-methoxyphenyl)-imidazole dimer, 2-(o-fluorophenyl)-4,5-diphenylimidazole dimer, 2-(o-methylphenyl)-4,5-diphenylimidazole dimer, 2-(p-methoxy-phenyl)-4,5-diphenylimidazole dimer, 2,4-di(p-methoxy-phenyl)-5-phenylimidazole dimer, 2-(2,4-dimethoxyphenyl)-4,5-diphenylimidazole dimer, 2-(p-methylmercaptophenyl)-4,5-diphenylimidazole dimer and the like; acridine derivatives such as 9-phenylacridine, 1,7-bis(9,9'-acridinyl)-heptane and the like; phenanthrenequinones such as 9,10-phenanthrenequinone and the like, etc. Among them, the 2,4,5-triarylimidazole dimers are preferable from the viewpoint of sensitivity and resolution. These photo-polymerization initiators may be used either singly or in combination of two or more compounds.

In the photosensitive resin composition comprising the above-mentioned components (a), (b) and (c), the amount of component (a) is preferably in the range of from 40 to 80 parts by weight per 100 parts by weight of the sum of components (a) and (b). If the amount of component (a) is less than 40 parts by weight, the photo-cured product tends to be brittle with inferior coating characteristics. If the amount of component (a) exceeds 80 parts by weight, sensitivity tends to be insufficient.

In the photosensitive resin composition comprising components (a), (b) and (c), the amount of component (b) is preferably in the range of from 20 to 60-parts by weight per 100 parts by weight of the sum of components (a) and (b). If the amount of component (b) is less than 20 parts by weight, sensitivity tends to be insufficient. If the amount of component (b) exceeds 60 parts by weight, the photo-cured product tends to be brittle.

In the photosensitive resin composition comprising components (a), (b) and (c), the amount of component (c) is preferably in the range of from 0.1 to 20 parts by weight per 100 parts by weight of the sum of components (a) and (b). If the amount of component (c) is less than 0.1 part by weight, sensitivity tends to be insufficient. If the amount of component (c) exceeds 20 parts by weight, there is a tendency that an increasing quantity of light tends to be absorbed at the surface of composition at the time of exposure, which brings about an insufficient photo-cure in the internal regions of the composition.

Into the photosensitive resin composition used in this invention may be incorporated, if necessary, a plasticizer, a thermal polymerization inhibitor, a color-developer such as leuco-Crystal Violet, tribromomethylphenyl sulfone and the like, a dye such as Malachite Green and the like, a pigment, a filler, an adhesiveness improver, a perfume, an imaging agent, etc.

The photosensitive resin composition comprising the components (a), (b) and (c) is formed into a photosensitive resin layer (B) by adding a solvent to the composition to prepare a solution, if necessary, and then coating the solution on a support film (A) and drying the coat. Then, a protecting film (C) is stuck onto the photosensitive resin layer to prepare a photosensitive film.

The solvent used for this purpose is not particularly limited, but all the known solvents can be used. Examples of the solvent include acetone, methyl ethyl ketone, methyl isobutyl ketone, ethylene glycol monomethyl ether, ethylene glycol monoethyl ether, chloroform, methylene chloride, toluene, methanol, ethanol and the like. These solvents may be used either as a single solvent or in combination of two or more solvents.

Thickness of the photosensitive resin layer must be in the range of 5 to 30 μm. If the thickness is smaller than 5 μm, follow-up characteristics are deteriorated and defective pattern appears or breakage of wire occurs. If the thickness is greater than 30 μm, resolution is deteriorated. Preferable thickness is 10 to 25 μm.

Viscosity (at 30° C.) of the photosensitive resin layer is preferably in the range of from 15 to 50 MPa·s, and further preferably in the range of from 25 to 40 MPa·s. If the viscosity is lower than 15 MPa·s at 30° C., exudation of the resin, called "edge fusion", tends to occur readily. If the viscosity is higher than 50 MPa·s at 30° C., flow property of the resin is deteriorated which facilitates generation of micro-voids. The viscosity can be measured by the use of the following equation (I) expressing the behavior of a Newtonian fluid, namely by plotting t against 1/Z4 and measuring the slope of the line:

$$t = \eta \frac{3V^2}{8\pi F} \left( \frac{1}{Z^4} - \frac{1}{Z_0^4} \right) \quad (1)$$

wherein η is viscosity (Pa·s),
F is force applied in the direction of thickness (N),
V is volume of test piece ($m^3$)
Z is thickness (m), and
t is time (second).

The measurement can be practiced by means of TMA apparatus.

The number of fish eyes having a diameter (ϕ) of at least 80 μm included in the protecting film used in this invention must be 5/$m^2$ or less. As used herein, the term "fish eye" means unmelted or deteriorated region of the raw material which has been taken into film at the time of thermally melting the raw material and forming it into a film by kneading, extrusion, stretching or casting.

Although the diameter of the fish eye varies depending on material, it is from about 10 μm to about 1 mm. The height of the fish eye from film surface is from about 1 μm to about 50 μm. The size of fish eye can be measured by means of, for instance, optical microscope, contact type surface roughness meter or scanning electron microscope. The diameter (ϕ) of fish eye means its maximum diameter.

As to surface roughness of the protecting film, it is preferable that the center line-averaged roughness Ra is from 0.005 to 0.05 μm, and it is further preferable that Ra is from 0.01 to 0.03 μm. The surface roughness can be measured by means of contact type surface roughness meter.

A protecting film of good fish eye level which can successfully be used in this invention can be produced by modifying the production method of film, for instance, in such a manner as filtering the raw material resin after thermal melting.

Some commercially available polypropylene films such as Torayfan BO-2400, YR12 type manufactured by Toray Industries, Inc., ALPHAN E200 series manufactured by Oji Paper Co., Ltd. and the like can also be referred to as examples of the protecting films preferably usable in this invention, though they are not limitative.

Film thickness of the protecting film (C) is preferably in the range of from 5 to 50 μm, preferably 5 to 30 μm. If the thickness is smaller than 5 μm, such a film tends to be difficult to manufacture. If the thickness is larger than 50 μm, price of the film tends to be high.

It is preferable that adhesive strength between the photosensitive resin composition-containing photosensitive resin layer (B) and the support film (A) is greater than adhesive strength between the photosensitive resin composition-containing photosensitive resin layer (B) and the protecting film (C). If adhesive strength between the photosensitive resin composition-containing photosensitive resin layer (B) and the support film (A) is smaller than adhesive strength between the photosensitive resin composition-containing photosensitive resin layer (B) and the protecting film (C), there is a possibility that the photosensitive resin layer is transferred onto the protecting film upon removal of the protecting film at the time of lamination.

The photosensitive film of this invention can be successfully used as a photosensitive film for metal etching fabrications of lead frame, metal mask, etc.

Next, this invention is explained in more detail with reference to Examples. This invention is by no means limited by these Examples.

Examples 1-3 and Comparative Examples 1-2

A solution was prepared by mixing together the components (a), (b) and (c) shown in Table 1.

$$t = \eta \frac{3V^2}{8\pi F}\left(\frac{1}{Z^4} - \frac{1}{Z_0^4}\right) \tag{1}$$

On the other hand, a copper alloy plate having a thickness of 0.15 mmt and a size of 20×20 cm square (trade name C-7025) manufactured by YAMAHA-OLIN METAL Co. was immersed in 3% (by weight) aqueous solution of sodium hydroxide at 50° C. for one minute and then in a 1% (by

TABLE 1

| | Material | | Amount | | |
|---|---|---|---|---|---|
| | | | Formulation 1 | Formulation 2 | Formulation 3 |
| Component (a) | 40% (by weight) solution of methacrylic acid/methyl methacrylate/butyl methacrylate/2-ethylhexyl acrylate copolymer (25/50/5/20 by weight) having a weight average molecular weight of 80,000 in 6/4 (by weight) mixture of methyl cellosolve and toluene | | 1<br>150 g<br>(solid content 60 g) | 1'<br>160 g<br>(solid content 64 g) | 140 g<br>(solid content 56 g) | 150 g<br>(solid content 60 g) |
| Component (b) | 2,2-Bis(4-methacryloxypentaethoxyphenyl)-propane (trade name BPE-500, manufactured by Shin-Nakamura Kagaku Kogyo K.K.) | | 40 g | | 44 g | 40 g |
| Component (c) | Benzophenone | | 5 g | | | 0 g |
| | N,N'-Tetraethyl-4,4-diaminobenzophenone | | 0.3 g | | | 0.3 g |
| | 2-(o-chlorophenyl)-4,5-diphenylimidazole dimer | | 0 g | | | 4 g |
| Other components | Color developer | Tribromomethylphenyl sulfone | 1.0 g | | | 0 g |
| | | Leuco-Crystal Violet | 1.0 g | | | 1.0 g |
| | Dye | Malachite Green | 0.1 g | | | 0.1 g |
| | Solvent | Methyl ethyl ketone | 10 g | | | 10 g |
| | | Toluene | 10 g | | | 10 g |
| | | Methanol | 3 g | | | 3 g |

Next, the solution of photosensitive resin composition obtained above was uniformly coated onto a polyethylene terephthalate film having a thickness of 16 μm and dried for 5 minutes in a hot air circulation type oven kept at 100° C. Then, each of the protecting films shown in Table 2 were laminated thereon to obtain various photosensitive films. After dryness, thickness of the photosensitive resin layer was 15 μm.

The photosensitive films obtained above were superposed so that the photosensitive resin layers thereof came into mutual contact, to prepare a test piece having a thickness of 1 mm and a diameter of 7 mm. Using a IMA apparatus (Thermal Analysis TMA/SS100, manufactured by Seiko Denshi K.K.), a load of 2 to 40 g was applied to the test piece in the direction of thickness thereof at a temperature of 30 to 80° C., and the change in thickness was measured. Then, using the equation (I) relating to Newtonian fluid, t was plotted against $1/Z^4$. Slope of the line gave viscosity.

volume) aqueous solution of hydrochloric acid at 25° C. for one minute, and then washed with water and dried to obtain a substrate. The photosensitive film obtained above was laminated on the substrate while removing the protecting film at a roll temperature of 110° C., under a pressure of 4 kg·f/cm², at a speed of 2 m/minute. The laminated substrate thus obtained was exposed to light by means of a 3 kW Super-High Pressure Mercury Lamp (HMW-201GX, manufactured by ORC Seisakusho, Ltd.) at 50 mJ/cm².

After the exposure, the number of air voids on the substrate was counted under a microscope at a multiplication of 100. Further, the size and number of fish eyes on each protecting film were measured under a microscope at a multiplication of 100.

The results are summarized in Table 2.

TABLE 2

| | Protecting film | | Number of fish eyes | | Viscosity (Mpa·s) | Number of air voids generated (per m²) | Removability of protecting film |
|---|---|---|---|---|---|---|---|
| No. | Kind | Film thickness (μm) | (φ ≧ 80 μm) (per m²) | Formulation | | | |
| Example 1 | GS-16 (manufd. by Teijin, Ltd.) | 16 | 0 | 1<br>1'<br>2 | 40<br>55<br>25 | 0<br>5<br>0 | ○<br>○<br>○ |
| Example 2 | PP-Type PT (manufd. by Shin-Etsu Film Co.) | 25 | 0 | 1<br>1'<br>2 | 40<br>55<br>25 | 0<br>5<br>0 | ◎<br>◎<br>◎ |
| Example 3 | BO-2400 (manufd. by Toray | 25 | 0 | 1<br>1' | 40<br>55 | 0<br>5 | ◎<br>◎ |

TABLE 2-continued

| No. | Protecting film Kind | Film thickness (μm) | Number of fish eyes (φ ≧ 80 μm) (per m²) | Formulation | Viscosity (Mpa·s) | Number of air voids generated (per m²) | Removability of protecting film |
|---|---|---|---|---|---|---|---|
| Comparative Example 1 | NF-13 (manufd. by Tamapoly Co.) Industries, Inc.) | 25 | ca. 1,000 | 1 2 | 40 25 | ca. 900 ca. 500 | ◎ ◎ |
| Comparative Example 2 | PP-Type R (manufd. by Shin-Etsu Film Co.) | 25 | ca. 1,200 | 1 | 40 | ca. 1,000 | ◎ |
| Example 4 | E 200C (manufd. by Oji Paper Co., Ltd.) | 20 | 0 | 1 1' 3 | 40 55 40 | 0 3 0 | ◎ ◎ ◎ |

Note)
GS-16: Polyethylene terephthalate film
PP-Type PT, PP-Type R, BO-2400, E 200C: Polypropylene film
NF-13: Polyethylene film
◎: Excellent - A protecting film was removed from a photosensitive resin layer smoothly and easily.
○: Good - A protecting film was removed from a photosensitive resin layer relatively smoothly and easily.

It is apparent from Table 2 that the generation of air voids causing breakage of wire and appearance of defective pattern can be suppressed by using, as the protecting film (C), a film in which the number of fish eyes having a diameter (φ) of at least 80 μm does not exceed 5/m².

The photosensitive film of this invention reduces the number of air voids generated which cause occurrence of defective pattern and breakage of wire, and therefore it is quite useful for improvement of product yield in the metallic precision fabrications.

The invention claimed is:

1. A photosensitive film which comprises:
   a polyethylene terephthalate support film (A);
   an alkali-developable photosensitive resin composition-containing photosensitive resin layer (B) formed on said support film (A); and
   a protecting film (C) stuck onto said photosensitive resin layer (B), wherein the alkali-developable photosensitive resin composition in said photosensitive resin layer (B) comprises
   (a) a binder polymer;
   (b) a bisphenol A (meth)acrylate; and
   (c) a photopolymerization initiator; and
   wherein the number of fish eyes having a diameter of at least 80 μm included in said protecting film (C) does not exceed 5 fish eyes/m² and said alkali-developable photosensitive resin composition-containing photosensitive resin layer (B) has a film thickness of 5 to 30 μm.

2. A photosensitive film according to claim 1, the binder polymer (a) is formed by copolymerizing acrylic acid or methacrylic acid and alkyl esters thereof as constituent monomers.

3. A photosensitive film according to claim 1, wherein adhesive strength between the photosensitive resin composition-containing photosensitive resin layer (B) and the support film (A) is greater than adhesive strength between the photosensitive resin composition-containing photosensitive resin layer (B) and the protecting film (C).

4. A photosensitive film according to claim 3, wherein said protecting film is a polypropylene film.

5. A photosensitive film according to claim 1, wherein said photosensitive film is for use in metal etching process.

6. A photosensitive film according to claim 2, wherein said photosensitive resin layer has a viscosity of 15 to 50 Mpa·s at 30° C.

7. A photosensitive film according to claim 1, wherein said protecting film has a thickness of 5 to 50 μm.

8. A photosensitive film according to claim 1, wherein said binder polymer (a) contains a carboxyl group-containing monomer in an amount of 12 to 40% by weight based on the total amount of the monomers, has a weight-average molecular weight of 20,000 to 300,000, and is used in an amount of 40 to 80 parts by weight, said monomer (b) is used in an amount of 20 to 60 parts by weight and said photopolymerization initiator (c) is used in an amount of 0.1 to 20 parts by weight, based on 100 parts by weight of the total amounts of (a) and (b).

9. A photosensitive film according to claim 1, wherein said photopolymerization initiator is a 2,4,5-triarylimidazole dimer.

10. A photosensitive film which comprises:
    a polyethylene terephthalate support film (A);
    a photosensitive resin composition-containing photosensitive resin layer (B) formed on said support film (A); and
    a protecting film (C) stuck onto said photosensitive resin layer (B), wherein the protecting film (C) comprises filtered resin, and wherein the photosensitive resin composition in said photosensitive resin layer (B) comprises
    (a) a binder polymer;
    (b) a bisphenol A (meth)acrylate; and
    (c) a photopolymerization initiator; and
    wherein the number of fish eyes having a diameter of at least 80 μm included in said protecting film (C) does not exceed 5 fish eyes/m² and said photosensitive resin composition-containing photosensitive resin layer (B) has a film thickness of 5 to 30 μm.

11. A photosensitive film which comprises:
    a polyethylene terephthalate support film (A);
    an alkali-developable photosensitive resin composition-containing photosensitive resin layer (B) formed on the support film (A); and
    a protecting film (C) stuck onto said photosensitive resin layer (B), wherein the protecting film (C) comprises filtered resin and wherein the alkali-developable photosensitive resin composition in the photosensitive resin layer (B) comprises (a) a binder polymer;
(b) a bisphenol A (meth)acrylate; and
(c) a photopolymerization initiator; and wherein the number of fish eyes having a diameter of at least 80 μm included in the protecting film (C) does not exceed 5 fish eyes/m² and the alkali-developable photosensitive resin composition-containing photosensitive resin layer (B) has a film thickness of 5 to 30 μm and a viscosity of 15 to 50 MPa·s at 30° C.

12. A photosensitive film which comprises:

a polyethylene terephthalate support film (A);

an alkali-developable photosensitive resin composition-containing photosensitive resin layer (B) formed on the support film (A); and a protecting film (C) stuck onto said photosensitive resin layer (B), wherein the protecting film (C) comprises filtered resin and wherein the alkali-developable photosensitive resin composition in the photosensitive resin layer (B) comprises:

(a) a binder polymer;
(b) a bisphenol A (meth)acrylate; and
(c) a photopolymerization initiator; and wherein the number of fish eyes having a diameter of at least 80 μm included in the protecting film (C) does not exceed 5 fish eyes/m² and the alkali-developable photosensitive resin composition-containing photosensitive resin layer (B) has a film thickness of 5 to 30 μm and a viscosity of 15 to 50 MPa·s at 30° C., and wherein the center roughness of the protecting film (C) in terms of the center line-averaged roughness Ra is 0.005 to 0.05 μm.

13. A photosensitive film according to claim 10, wherein the filtered resin is resin that has been filtered after thermal melting.

* * * * *